(12) United States Patent
Lichtenwalner et al.

(10) Patent No.: US 9,570,570 B2
(45) Date of Patent: Feb. 14, 2017

(54) ENHANCED GATE DIELECTRIC FOR A FIELD EFFECT DEVICE WITH A TRENCHED GATE

(71) Applicant: Cree, Inc., Durham, NC (US)

(72) Inventors: Daniel Jenner Lichtenwalner, Raleigh, NC (US); Lin Cheng, Chapel Hill, NC (US); Anant Kumar Agarwal, Chapel Hill, NC (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 13/944,473

(22) Filed: Jul. 17, 2013

(65) Prior Publication Data

US 2015/0021623 A1    Jan. 22, 2015

(51) Int. Cl.
*H01L 29/78* (2006.01)
*H01L 29/66* (2006.01)
*H01L 29/423* (2006.01)
*H01L 21/04* (2006.01)
*H01L 29/51* (2006.01)
*H01L 29/16* (2006.01)

(52) U.S. Cl.
CPC ....... *H01L 29/42368* (2013.01); *H01L 21/045* (2013.01); *H01L 21/049* (2013.01); *H01L 29/513* (2013.01); *H01L 29/518* (2013.01); *H01L 29/66068* (2013.01); *H01L 29/7813* (2013.01); *H01L 29/1608* (2013.01)

(58) Field of Classification Search
USPC .............................................. 257/77; 438/270
See application file for complete search history.

(56) References Cited

U.S. PATENT DOCUMENTS

| | | | |
|---|---|---|---|
| 5,382,541 A * | 1/1995 | Bajor et al. | 438/427 |
| 6,573,534 B1 * | 6/2003 | Kumar | H01L 29/1608 257/328 |
| 2004/0142523 A1 * | 7/2004 | Bencuya | H01L 29/7813 438/197 |

(Continued)

FOREIGN PATENT DOCUMENTS

EP    1981076 A1    10/2008

OTHER PUBLICATIONS

D D Hass*, J F Groves, H.N.G. Wadley, Reactive vapor deposition of metal oxide coatings, Department of Materials Science and Engineering, School of Engineering and Applied Science, University of Virginia, pp. 85-93.*

(Continued)

*Primary Examiner* — Zandra Smith
*Assistant Examiner* — Lawrence Tynes, Jr.
(74) *Attorney, Agent, or Firm* — Anthony J. Josephson

(57) ABSTRACT

The present disclosure relates to a silicon carbide (SiC) field effect device that has a gate assembly formed in a trench. The gate assembly includes a gate dielectric that is an dielectric layer, which is deposited along the inside surface of the trench and a gate dielectric formed over the gate dielectric. The trench extends into the body of the device from a top surface and has a bottom and side walls that extend from the top surface of the body to the bottom of the trench. The thickness of the dielectric layer on the bottom of the trench is approximately equal to or greater than the thickness of the dielectric layer on the side walls of the trench.

21 Claims, 7 Drawing Sheets

(MOSFET)

(56) References Cited

U.S. PATENT DOCUMENTS

| | | | |
|---|---|---|---|
| 2004/0211980 A1 | 10/2004 | Ryu | |
| 2007/0057262 A1 | 3/2007 | Nakamura et al. | |
| 2009/0142899 A1* | 6/2009 | Jensen | H01L 21/28079 438/287 |
| 2011/0291185 A1* | 12/2011 | Grover | H01L 29/404 257/334 |
| 2012/0248462 A1 | 10/2012 | Wada et al. | |
| 2012/0286291 A1 | 11/2012 | Hiyoshi et al. | |
| 2012/0326207 A1* | 12/2012 | Yoshimochi | H01L 29/866 257/139 |
| 2013/0078771 A1* | 3/2013 | Hiyoshi | H01L 29/7395 438/135 |
| 2013/0119407 A1 | 5/2013 | Masuda et al. | |
| 2013/0146969 A1 | 6/2013 | Fujiwara et al. | |

OTHER PUBLICATIONS

Blanc, C. et al., "Process Optimisation for <11-20> 4H-SiC MOSFET Application," Materials Science Forum, vols. 527-529, Oct. 2006, pp. 1051-1054.

Endo, Takeshi et al., "High Channel Mobility of Mosfet Fabricated on 4H-SiC (11-20) Face Using Wet Annealing," Materials Science Forum, vols. 600-603, Sep. 2009, pp. 691-694.

Nanen, Yuichiro et al., "Effects of Nitridation on 4H-SiC MOSFETs Fabricated on Various Crystal Faces," IEEE Transactions on Electron Devices, vol. 60, No. 3, Mar. 2013, pp. 1260-1262.

Senzaki, Junji et al., "Effective Normal Field Dependence of Inversion Channel Mobility in 4H-SiC MOSFETs on the (1120) Face," Materials Science Forum, vols. 433-436, Sep. 2003, pp. 613-616.

Yano, H. et al., "Increased Channel Mobility in 4H-SiC UMOSFETs Using On-Axis Substrates," Materials Science Forum, vols. 556-557, Sep. 2007, pp. 807-810.

Yano, Hiroshi et al., "A Cause for Highly Improved Channel Mobility of 4H-SiC Metal-Oxide-Semiconductor Field-Effect Transistors on the (110) Face," Applied Physics Letters, vol. 78, No. 3, Jan. 15, 2001, pp. 374-376.

Yano, Hiroshi et al., "High Channel Mobility in Inversion Layers of 4H-SiC MOSFET's by Utilizing (1120) Face," IEEE Electron Device Letters, vol. 20, No. 12, Dec. 1999, pp. 611-613.

International Search Report and Written Opinion for PCT/US2014/046505, mailed Apr. 2, 2015, 13 pages.

International Preliminary Report on Patentability for International Patent Application No. PCT/US2014/046505, mailed Jan. 28, 2016, 10 pages.

\* cited by examiner

ENHANCED GATE DIELECTRIC FOR A FIELD EFFECT DEVICE WITH A TRENCHED GATE

GOVERNMENT SUPPORT

This invention was made with government funds under contract number W911NF-10-2-0038 awarded by the U.S. Army. The U.S. Government has rights in this invention.

FIELD OF THE DISCLOSURE

The present disclosure relates to enhanced gate dielectrics for field effect devices.

BACKGROUND

Semiconductor devices, especially those designed to block high voltages and conduct large currents in high power applications, are subjected to powerful electrical forces and electromagnetic fields at the molecular level. Further, these devices may be subjected to high temperatures during fabrication and operation. These forces, fields, and temperatures can damage the molecular structure of the various layers and regions within the device, as well as the interface between these various layers or regions. Such damage leads to device failures as well as degraded performance over time. For field effect devices employing a metallized gate that is separated from the body of the device by a dielectric layer, the dielectric layer and the interface between the dielectric layer and the body are particularly vulnerable. As such, there is a need for a gate dielectric for a field effect device that is less vulnerable to the forces and fields that are generated in high voltage and current applications as well as the potentially damaging temperatures associated with fabrication and operation.

SUMMARY

The present disclosure relates to a silicon carbide (SiC) field effect device that has a gate assembly formed in a trench. The gate assembly includes a gate dielectric that is a dielectric layer, which is deposited along the inside surface of the trench, and a gate dielectric formed over the gate dielectric. The trench extends into the body of the device from a top surface, has a bottom, and has side walls that extend from the top surface of the body to the bottom of the trench. The thickness of the dielectric layer on the bottom of the trench is approximately equal to or greater than the thickness of the dielectric layer on the side walls of the trench. The thickness of the dielectric layer on the bottom surface may exceed that of the side walls by 25%, 50%, 100% or more. The side walls may be substantially orthogonal to the top surface or may form an angle of less than 90° with the top surface, such that the trench is generally V-shaped.

In one embodiment, a nitrogen passivation is provided at the interface between the dielectric layer and the trench due to the dielectric layer being annealed with nitric oxide (NO). The nitrogen passivation provides an excellent interface between the dielectric layer and the trench. The dielectric layer may be silicon dioxide ($SiO_2$), aluminum oxide ($AlO_2$), magnesium oxide (MgO), or the like. Alternatively, the dielectric layer may be formed from multiple layers of dielectric oxides, nitrides, or both as well as mixed alloys of similar dielectrics.

An exemplary process for forming the field effect device includes providing a field effect device precursor that includes a body and forming the trench into the top surface of the body using an etching or mechanical cutting process. Next, the dielectric layer for the gate dielectric is deposited, as opposed to thermally grown, using a deposition process, such as a chemical vapor deposition (CVD) or an evaporative process. The dielectric layer may be annealed in an oxidant, such as oxygen ($O_2$), nitrous oxide ($N_2O$), water, or the like. This annealing step is optional, but may be used to improve the insulating properties of the gate dielectric. The dielectric layer is then annealed in nitric oxide (NO) to increase the density of the dielectric layer, enhance the interface between the dielectric layer and the trench, or both. Annealing with nitric oxide (NO) allows nitrogen (N) to build up at the interface between the dielectric layer and the trench, and thus, provide the nitrogen passivation at the interface.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
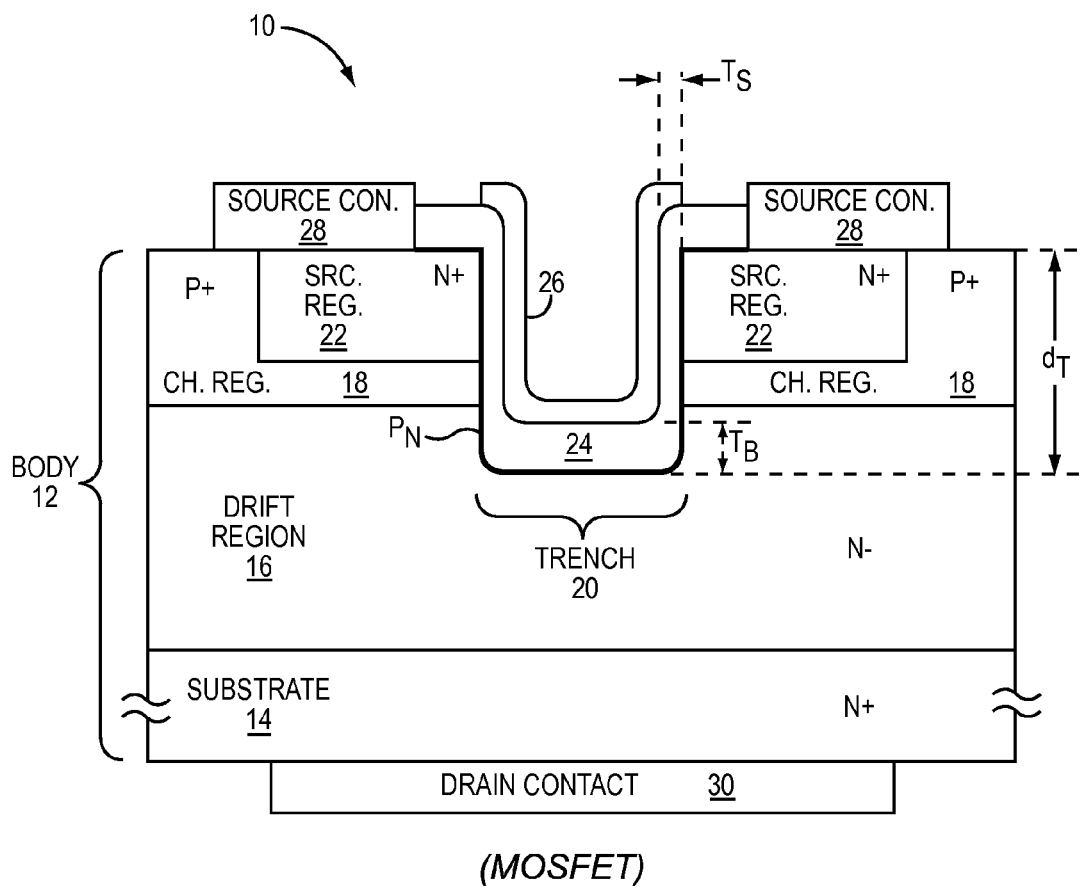
FIG. 1 illustrates a MOSFET that has a gate structure formed according to a first embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

With reference to FIG. 1, a first embodiment of a field effect device 10 is illustrated. The field effect device is a silicon carbide (SiC) metal oxide field effect transistor (MOSFET) that has a body 12, which includes a substrate 14, a drift region 16 over the substrate 14, and a channel region 18 over the drift region 16. A trench 20 extends into the body 12 from a top surface of the body 12. As illustrated, the trench 20 may extend through the channel region 18 and into the drift region 16 to a depth $d_T$. As such, the trench 20 divides the channel region 18. Source regions 22 are effectively formed in the channel regions 18 on either side of the trench 20.

The substrate 14 may be an N-doped, single crystal, SiC substrate 14. The substrate 14 may have various crystalline polytypes, such as 2H, 4H, 6H, 3C and the like. In other embodiments, the substrate 14 may also be formed from other material systems, such as gallium nitride (GaN), gallium arsenide (GaAs), silicon (Si), germanium (Ge), SiGe, and the like. The substrate may be heavily doped with an N-type dopant at concentrations of between about $1\times10^{17}$ $cm^{-3}$ and $1\times10^{19}$ $cm^{-3}$ and have a thickness of between about 100 microns and 600 microns; however, the doping concentrations and thicknesses of the substrate 14 and the other layers may vary based on the desired parameters of the field effect device 10.

A SiC drift region 16 may be grown over the substrate 14 and doped in situ, wherein the drift region 16 is lightly doped as it is grown with an N-type doping material. Notably, one or more buffer layers (not shown) may be formed on the substrate 14 prior to forming the drift region 16. The buffer layer(s) may be used as a nucleation layer and be relatively heavily doped with an N-type doping material.

The drift region 16 may be relatively uniformly doped throughout or may employ graded doping throughout all or a portion thereof. For a uniformly doped drift region 16, the doping concentration may be between about $1\times10^{14}$ $cm^{-3}$ and $1\times10^{16}$ $cm^{-3}$ in one embodiment. With graded doping, the doping concentration is highest at the bottom of the drift region 16 near the substrate 14 and lowest at the top of the drift region 16. The doping concentration generally decreases in a stepwise or continuous fashion from a point at or near the bottom to a point at or near the top of the drift region 16. In one embodiment employing graded doping, the lower portion of the drift region 16 may be doped at a concentration of about $1\times10^{14}$ $cm^{-3}$ and the upper portion of the drift region 16 may be doped at a concentration of about $1\times10^{16}$ $cm^{-3}$. The drift region 16 may be between four and ten microns thick in select embodiments depending on the desired parameters of the field effect device 10.

A SiC channel region 18 may be grown over the drift region 16 and doped in situ, wherein the channel region 18 is heavily doped as it is grown with a P-type doping material at concentrations between about $1\times10^{17}$ $cm^{-3}$ and $5\times10^{18}$ $cm^{-3}$. The channel region 18 at its thickest point may be between about 1 microns and 5 microns. Prior to the trench 20 being formed, the source regions 22 are effectively created as a single source well in the channel region 18 and heavily doped with an N-type doping material.

The trench 20 is etched from the top surface of the body 12 through the central portion of the source well and the channel region 18 and into the drift region 16. As a result, a channel region 18 and a source region 22 are provided on each side of the trench 20. Both side walls of the trench 20 are formed from portions of the source region 22, the channel regions 18, and the drift region 16. The bottom of the trench 20 resides in the drift region 16 and extends between the lower ends of the side walls of the trench 20. In the embodiment of FIG. 1, the side walls of the trench 20 are substantially orthogonal to the top surface of the body 12, and the bottom of the trench 20 is substantially parallel to the top surface of the body 12. In one embodiment, the corners between the bottom and the side walls of the trench 20 are rounded to reduce electric field concentrations, which would be higher with sharper corners.

The gate assembly for the field effect device 10 is formed in the trench 20 and includes a uniquely formed dielectric layer 24 and a gate contact 26. The dielectric layer 24 is formed substantially continuously along the side walls and bottom of the trench 20. The gate contact 26 is formed on the dielectric layer 24. The dielectric layer 24 may be an oxide, such as silicon dioxide ($SiO_2$), aluminum oxide ($AlO_2$), magnesium oxide (MgO). Alternatively, the dielectric layer 24 may be formed from multiple layers of dielectric oxides, nitrides, or both as well as mixed alloys of similar dielectrics. For the following example, the dielectric layer 24 is an oxide. The gate contact 26 is generally relatively thick and formed from a highly doped semiconductor such as Si or Ge, or a metal, such as aluminum (Al), gold (Au), Silver (Ag), and the like.

Unlike other SiC-based field effect devices with a gate assembly formed in a trench, the bottom thickness $T_B$ of the dielectric layer 24 on the bottom of the trench 20 is approximately equal to or greater than the side thickness $T_S$ of the dielectric layer 24 on the side walls of the trench 20. For example, the thickness of the dielectric layer 24 on the bottom surface may exceed that of the side walls by 25% or more, 50% or more, or even 100% or more. As illustrated, the bottom of the trench 20 is approximately 100%, or two times, greater than the side thickness $T_S$ of the dielectric layer 24 on the side walls of the trench 20.

In conventional SiC field effect devices, the dielectric layer is grown using a thermal growth process. With a thermal growth process where the trench is etched into the Si-face (0001) SiC, the growth rate of the oxide on the bottom (Si-face (0001)) of the trench is around three times slower than that on the side walls, which may reside in the a-face {11-20} and m-face {10-10} family of planes. As a result, the thickness of the dielectric layer on the side walls is much thicker than the dielectric layer on the bottom of the trench. The thicker dielectric layer on the side walls leads to higher electric fields along the portion of the dielectric layer that is formed on the bottom of the trench than along the portions of the dielectric layer that are formed on the side walls of the trench. The higher electric fields along the portion of the dielectric layer along the bottom of the trench leads to device failure, and thus, reduces the long-term reliability of the field effect device.

To improve reliability, the present disclosure provides for the bottom thickness $T_B$ of the dielectric layer 24 on the bottom of the trench 20 to be approximately equal to or greater than the side thickness $T_S$ of the dielectric layer 24 on the side walls of the trench 20. As illustrated in the embodiment of FIG. 1, the bottom thickness $T_B$ of the dielectric layer 24 on the bottom of the trench 20 is substantially greater than the side thickness $T_S$ of the dielectric layer 24 on the side walls of the trench 20. A unique process for forming the dielectric layer 24 in this manner is provided further below.

With continued reference to FIG. 1, the MOSFET embodiment of the field effect device 10 includes source contacts 28 on the respective source regions 22 and one or more drain contacts 30 on the bottom surface of the substrate 14. Like the gate contact 26, the source and drain contacts 28, 30 may be formed from aluminum (Al), gold (Au), Silver (Ag), and the like.

In the embodiment of FIG. 1, the width of the trench 20 and the thicknesses of the dielectric layer 24 and the metal for the gate contact 26 on the side walls is such that the gate contact 26 is U-shaped. As such, an open trench is formed by the gate contact 26. Other materials may fill the open trench during subsequent processing steps.

Figure 2:
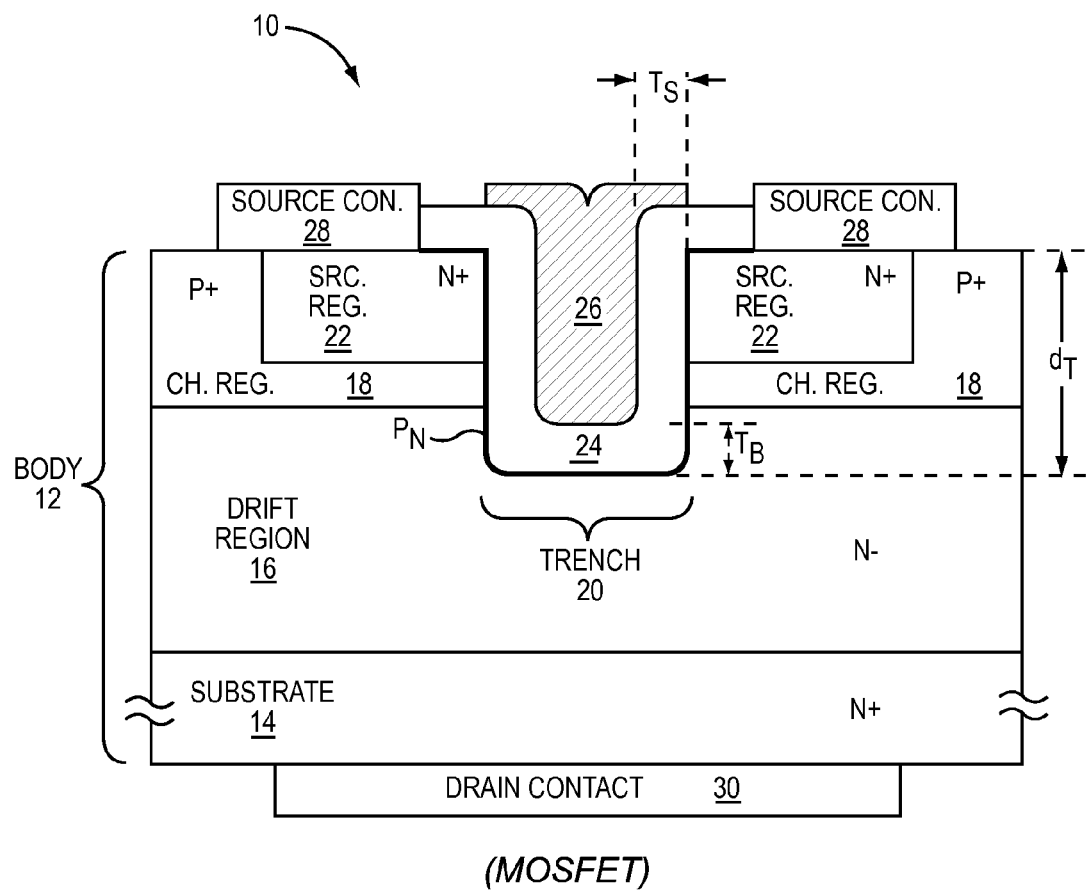
FIG. 2 illustrates a MOSFET that has a gate structure formed according to a second embodiment of the present disclosure.

FIG. 2 provides an alternative embodiment wherein the metal for the gate contact 26 completely, or at least substantially, fills any trench left over after the dielectric layer 24 has been deposited on the bottom and side walls of the trench 20. FIG. 2 also illustrates an embodiment wherein the bottom thickness $T_B$ of the dielectric layer 24 on the bottom of the trench 20 is approximately equal to the side thickness $T_S$ of the dielectric layer 24 on the side walls of the trench 20.

Figure 3:
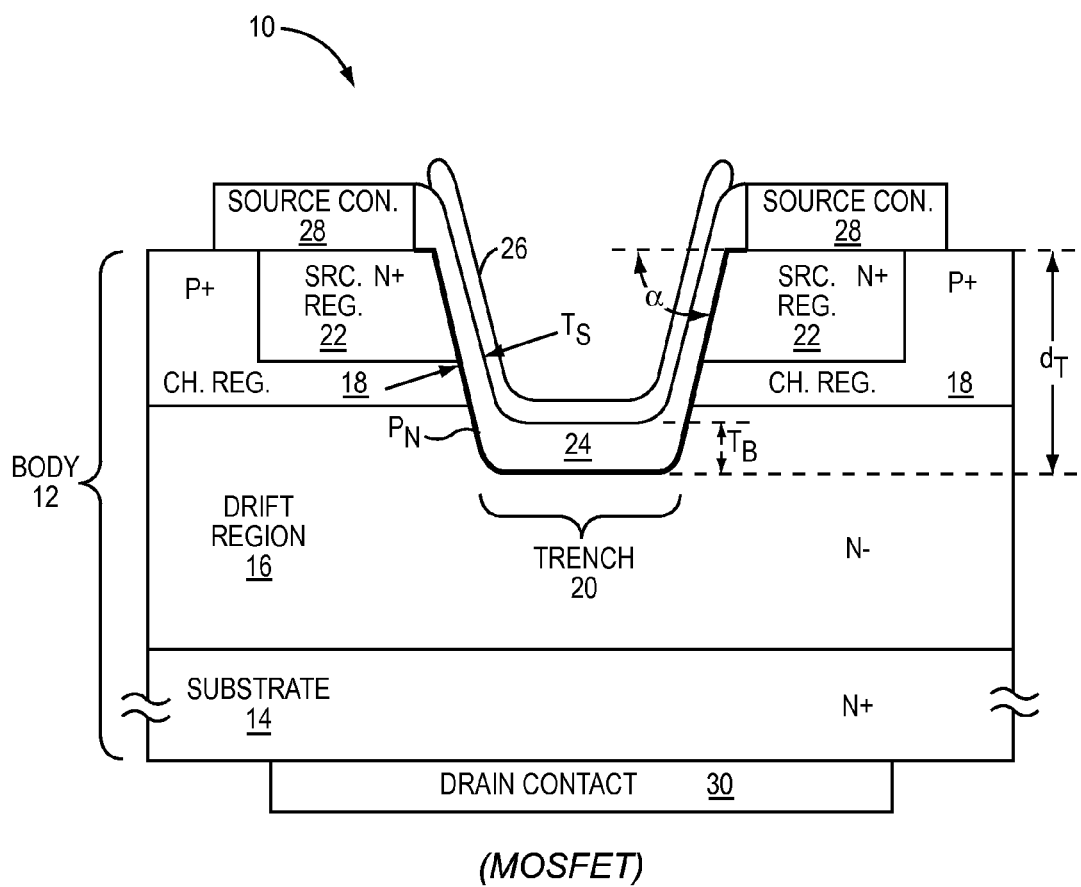
FIG. 3 illustrates a MOSFET that has a gate structure formed according to a third embodiment of the present disclosure.

With reference to FIG. 3, an embodiment is illustrated wherein the side walls of the trench 20 form an angle α of less than 90° with the top surface, such that the trench is generally V-shaped. As such, the side walls of the trench 20 do not need to be orthogonal to the top surface of the body 12. In the illustrated embodiment, the bottom thickness $T_B$ of the dielectric layer 24 on the bottom of the trench 20 is approximately 100%, or two times, greater than the side thickness $T_S$ of the dielectric layer 24 on the side walls of the trench 20. For example, the bottom thickness $T_B$ of the dielectric layer 24 on the bottom of the trench 20 may be between 80 and 100 nanometers (nm) while the side thickness $T_S$ of the dielectric layer 24 on the side walls of the trench 20 may be between 40 and 50 nm.

While keeping within the confines of the bottom thickness $T_B$ being substantially equal to or greater than the side thickness $T_S$, the bottom thickness $T_B$ may range between 20 and 200 nm or more, and the side thickness $T_S$ may range between 10 and 50 nm, 5 and 100 nm, and 25 and 75 nm, depending on the desired performance parameters. These measurements are solely for purposes of illustration and are not intended to limit the scope of this disclosure or the claims that follow.

Figure 4:
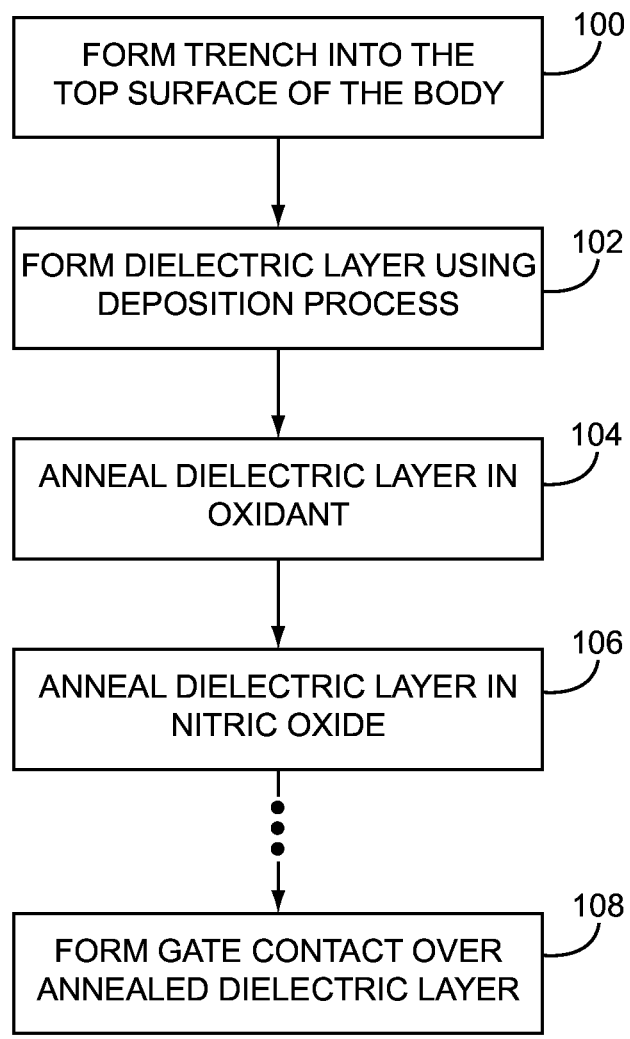
FIG. 4 illustrates one process for forming the gate structure of the embodiments provided in FIGS. 1 through 3.

With reference to the flow diagram of FIG. 4, an exemplary process is provided for forming the dielectric layer 24 such that the bottom thickness $T_B$ of the dielectric layer 24 on the bottom of the trench 20 is approximately equal to or greater than the side thickness $T_S$ of the dielectric layer 24 on the side walls of the trench 20. The process is performed on a field effect device precursor that includes the body 12 without the trench 20 being etched. Initially, the trench 20 is formed into the top surface of the body 12 wherein the top surface corresponds to the Si-face (0001) SiC (step 100). The trench 20 may be formed using standard etching processes, or perhaps a mechanical cutting process. The trench 20 will pass through the source regions 22 and the channel regions 18 into the drift region 16.

Once the trench 20 is formed, the dielectric layer is deposited using a deposition process until the bottom thickness $T_B$ of the dielectric layer 24 on the bottom of the trench 20 and the side thickness $T_S$ of the dielectric layer 24 on the side walls of the trench 20 reach desired levels (step 102). By using a deposition process, such as a CVD or evaporative process, as opposed to a thermal growth process, the bottom thickness $T_B$ of the dielectric layer 24 on the bottom of the trench 20 and the side thickness $T_S$ of the dielectric layer 24 on the side walls of the trench 20 are more readily controlled. Unlike a thermal growth process, a deposition process allows the dielectric layer 24 to form such that the bottom thickness $T_B$ of the dielectric layer 24 on the bottom of the trench 20 is approximately equal to or greater than the side thickness $T_S$ of the dielectric layer 24 on the side walls of the trench 20. If a thermal growth process were used to form the dielectric layer 24 in the trench 20 of a SiC-based body 12, the bottom thickness $T_B$ of the dielectric layer 24 on the bottom of the trench 20 would undesirably end up much less than the side thickness $T_S$ of the dielectric layer 24 on the side walls of the trench 20. Depending on the embodiment, the dielectric layer 24 may be silicon dioxide ($SiO_2$), aluminum oxide ($AlO_2$), magnesium oxide (MgO); or it may be formed from multiple layers of dielectric oxides or nitrides, from mixed alloys of similar dielectrics, or the like. A silicon dioxide ($SiO_2$) dielectric layer 24 is an effective match with SiC-based applications.

After the dielectric layer 24 is deposited, the dielectric layer may be annealed in an oxidant, such as oxygen ($O_2$), nitrous oxide ($N_2O$), water, or the like (step 104). The annealing may take place at a relatively high temperature, such as between 1100 and 1300 Celsius (C) and last for 0.1 to 10 hours. This annealing step is optional in this exemplary process, but may be used to improve the insulating properties of the dielectric layer 24.

Next, the dielectric layer 24 is annealed in nitric oxide (NO) (step 106). This step of annealing in nitric oxide (NO) has been found to increase the density of the dielectric layer 24 and enhance the molecular interface between the dielectric layer 24 and the trench 20. Annealing with nitric oxide (NO) allows nitrogen (N) to build up at the interface between the dielectric layer 24 and the trench 20, and thus, provides nitrogen passivation PN (see FIGS. 1-3, 5, and 6) at the interface. The annealing may take place at a relatively high temperature, such as between 1100 and 1300 Celsius (C) and last for 0.5 to 5 hours.

Finally, the gate contact 26 may be formed over the annealed dielectric layer 24 (step 108). The gate contact 26 may be formed in conjunction with forming the source contacts 28.

Figure 5:
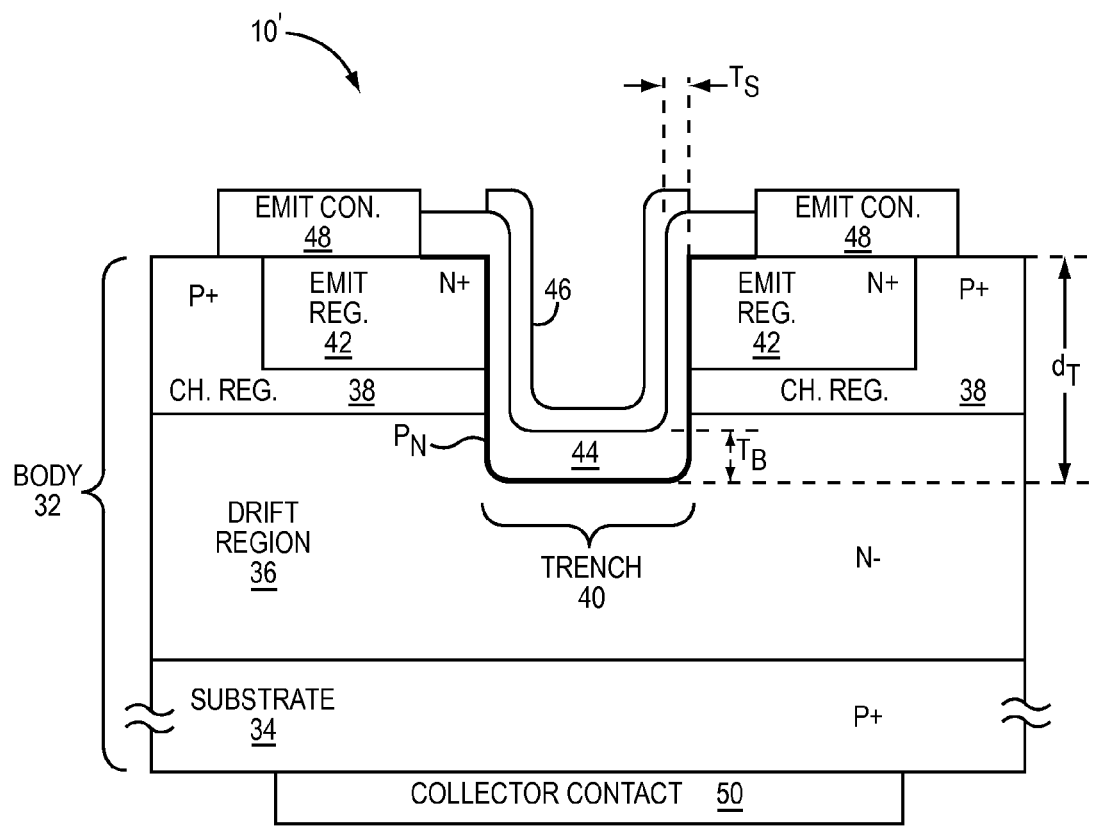
FIG. 5 illustrates an IGBT that has a gate structure formed according to a first embodiment of the present disclosure.

With reference to FIG. 5, a second embodiment of a field effect device 10' is illustrated. The field effect device 10' is a SiC insulated gate bipolar transistor (IGBT), which has a body 32 that is configured similarly to the MOSFET described above. The gate assembly is formed in the same manner as that described above. The body 32 of the IGBT includes a substrate 34, a drift region 36 over the substrate 34, and a channel region 38 over the drift region 36. A trench 40 extends into the body 32 from a top surface of the body 32. As described above, the trench 40 may extend through the channel region 38 and into the drift region 36 to a depth $d_T$. As such, the trench 40 divides the channel region 38. Emitter regions 42 are effectively formed in the channel regions 38 on either side of the trench 40.

In contrast with the MOSFET, the substrate 34 may be a P-doped, single crystal, SiC substrate 34. The substrate 34 may be heavily doped with a P-type dopant at concentrations of between about $1\times10^{16}$ cm$^{-3}$ and $1\times10^{19}$ cm$^{-3}$ and have a thickness of between about 2 microns and 500 microns; however, the doping concentrations and thicknesses of the substrate 34 and the other layers may vary based on the desired parameters of the IGBT variant of the field effect device 10'.

A SiC drift region 36 may be grown over the substrate 34 and doped in situ, wherein the drift region 36 is lightly doped as it is grown with an N-type doping material. Notably, one or more buffer layers (not shown) may be formed on the substrate 34 prior to forming the drift region 36. The buffer layer(s) may be used as a nucleation layer and be relatively heavily doped with an N-type doping material.

The drift region 36 may be relatively uniformly doped throughout or may employ graded doping throughout all or a portion thereof. For a uniformly doped drift region 36, the doping concentration may be between about $1\times10^{14}$ cm$^{-3}$ and $1\times10^{16}$ cm$^{-3}$ in one embodiment. With graded doping, the doping concentration is highest at the bottom of the drift region 36 near the substrate 34 and lowest at the top of the drift region 36. The doping concentration generally decreases in a stepwise or continuous fashion from a point at or near the bottom to a point at or near the top of the drift region 36.

A SiC channel region 38 may be grown over the drift region 36 and doped in situ, wherein the channel region 38 is heavily doped as it is grown with a P-type doping material at concentrations between about $1\times10^{17}$ cm$^{-3}$ and $5\times10^{18}$ cm$^{-3}$. Prior to a trench 40 being formed, the emitter regions 42 are effectively created as a single emitter well in the channel region 38 and heavily doped with an N-type doping material.

The trench 40 is etched from the top surface of the body 32 through the central portion of the emitter well and the channel region 38 and into the drift region 36. As a result, a channel region 38 and an emitter region 42 are provided on each side of the trench 40. Both side walls of the trench 40 are formed from portions of the emitter region 42, the channel regions 38, and the drift region 36. One or more collector contacts 50 are provided on the bottom surface of the substrate 34.

The bottom of the trench 40 resides in the drift region 36 and extends between the lower ends of the side walls of the trench 40. In the embodiment of FIG. 5, the side walls of the trench 40 are substantially orthogonal to the top surface of the body 32, and the bottom of the trench 40 is substantially parallel to the top surface of the body 32. As noted above, the corners between the bottom and the side walls of the trench 40 are rounded to reduce electric field concentrations, which would be higher with sharper corners.

As with the MOSFET embodiment, the gate assembly for the IGBT is formed in the trench 40 and includes a uniquely formed dielectric layer 44 and a gate contact 46. The dielectric layer 44 is formed substantially continuously along the side walls and bottom of the trench 40. The gate contact 46 is formed on the dielectric layer 44. As noted above, the bottom thickness $T_B$ of the dielectric layer 44 on the bottom of the trench 40 is approximately equal to or greater than the side thickness $T_S$ of the dielectric layer 24 on the side walls of the trench 40.

Figure 6:
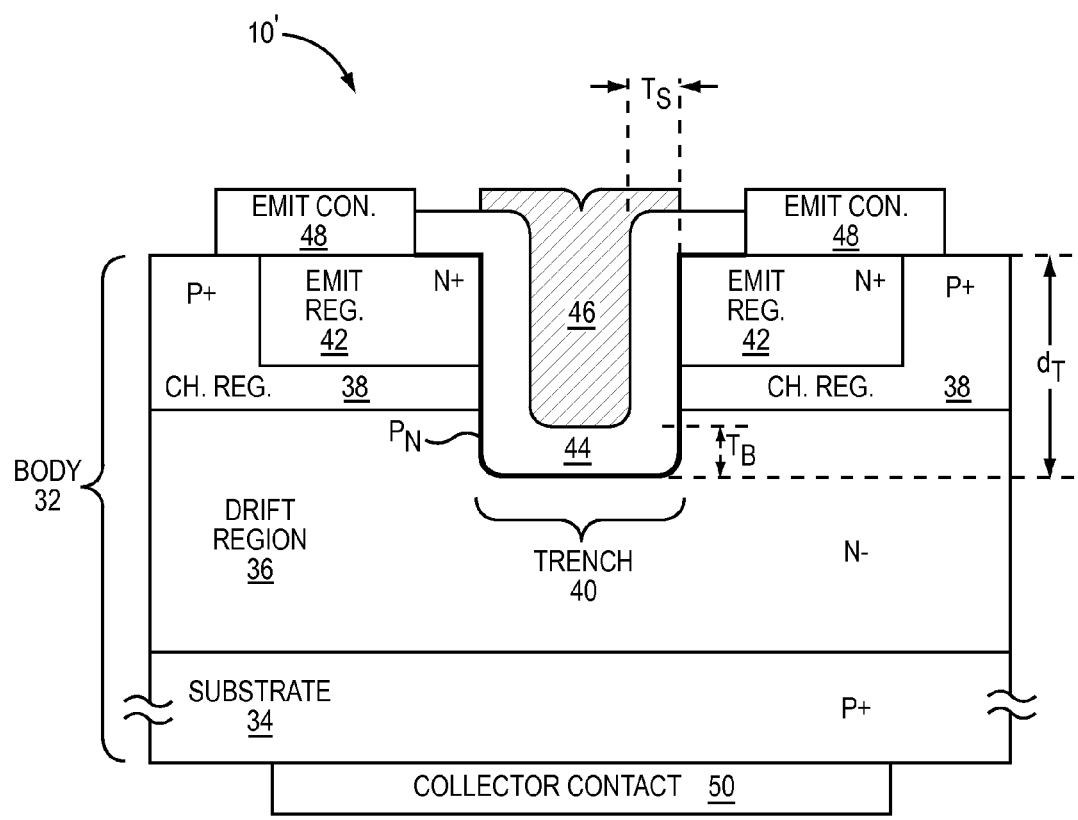
FIG. 6 illustrates an IGBT that has a gate structure formed according to a second embodiment of the present disclosure.
Figure 7:
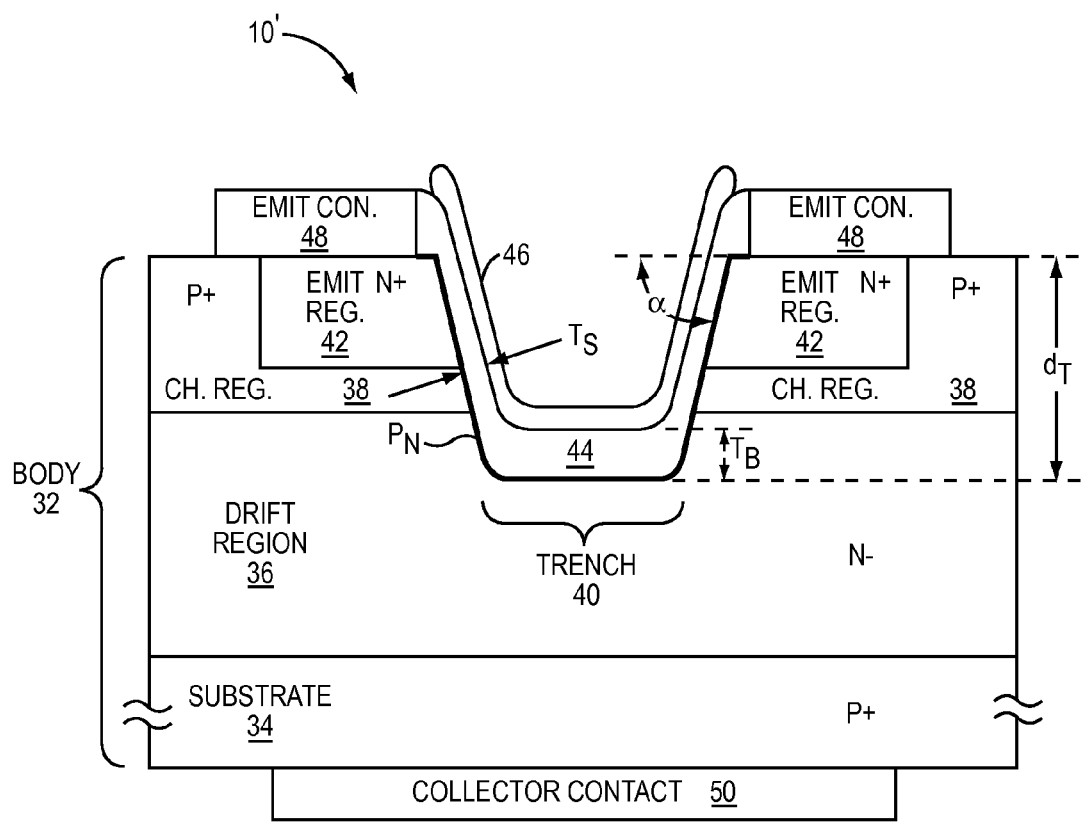
FIG. 7 illustrates an IGBT that has a gate structure formed according to a third embodiment of the present disclosure.

FIG. 6 provides an alternative embodiment wherein the metal for the gate contact 46 completely, or at least substantially, fills any trench left over after the dielectric layer 44 has been deposited on the bottom and side walls of the trench 40. FIG. 6 also illustrates an embodiment wherein the bottom thickness $T_B$ of the dielectric layer 44 on the bottom of the trench 40 is approximately equal to the side thickness $T_S$ of the dielectric layer 44 on the side walls of the trench 40. As another variant that is illustrated in FIG. 7, the trench 40 may be created such that the side walls of the trench 40 form an angle α of less than 90° with the top surface, such that the trench is generally V-shaped.

Those skilled in the art will recognize improvements and modifications to the preferred embodiments of the present disclosure. All such improvements and modifications are considered within the scope of the concepts disclosed herein and the claims that follow.

What is claimed is:

1. A method for fabricating a field effect device comprising:
   providing a body having a top surface;
   forming a trench extending into the body from the top surface wherein the trench has a bottom and a plurality of side walls;
   depositing a dielectric layer substantially along the plurality of side walls to a first thickness and the bottom of the trench to a second thickness, wherein a single evaporative process is used to deposit the dielectric layer such that the second thickness of the dielectric layer on the bottom of the trench is substantially greater than the first thickness of the dielectric layer on the plurality of side walls of the trench where the second thickness has a thickness in a range between about 25% greater than the first thickness and about 100% greater than the first thickness;

annealing the dielectric layer in nitric oxide; and forming a gate contact over the dielectric layer wherein the dielectric layer and the gate contact form a gate assembly for the field effect device and the body comprises silicon carbide.

2. The method of claim 1 further comprising annealing the dielectric layer in an oxidant prior to annealing the dielectric layer in the nitric oxide.

3. The method of claim 1 wherein the annealing with the nitric oxide results in nitrogen passivation at an interface between the dielectric layer and an inside surface of the trench.

4. The method of claim 1 wherein the dielectric layer is silicon dioxide.

5. The method of claim 1 wherein the dielectric layer is silicon dioxide and nitrogen passivation is provided at an interface between the dielectric layer and the inside surface of the trench.

6. The method of claim 1 wherein the body comprises a substrate, a drift region over the substrate, and channel regions on either side of the trench.

7. The method of claim 6 wherein the trench extends into the drift region.

8. The method of claim 7 wherein at least one of source or emitter contacts are provided over the top surface on either side of the trench and at least one of a drain or collector contact is provided over a bottom surface of the substrate.

9. A field effect device comprising:
a body having a top surface and a trench extending into the body from the top surface wherein the trench has a bottom and a plurality of side walls;
a deposited dielectric layer formed substantially along the plurality of side walls to a first thickness and the bottom of the trench to a second thickness, the deposited dielectric layer being formed via a single evaporative process such that the second thickness of the dielectric layer on the bottom of the trench is substantially greater than the first thickness of the dielectric layer on the plurality of side walls of the trench where the second thickness has a thickness in a range between about 25% greater than the first thickness and about 100% greater than the first thickness; and
a gate contact formed over the deposited dielectric layer wherein the deposited dielectric layer and the gate contact form a gate assembly for the field effect device and the body comprises silicon carbide.

10. The field effect device of claim 9 wherein the deposited dielectric layer is a nitric oxide annealed deposited dielectric layer.

11. The field effect device of claim 9 wherein a nitrogen passivation is provided at an interface between the deposited dielectric layer and an inside surface of the trench.

12. The field effect device of claim 9 wherein the deposited dielectric layer is silicon dioxide.

13. The field effect device of claim 9 wherein the deposited dielectric layer is silicon dioxide, the deposited dielectric layer is a nitric oxide annealed deposited dielectric layer, and a nitrogen passivation is provided at an interface between the deposited dielectric layer and an inside surface of the trench.

14. The field effect device of claim 9 wherein the body comprises a substrate, a drift region over the substrate, and channel regions on either side of the trench.

15. The field effect device of claim 14 wherein the trench extends into the drift region.

16. The field effect device of claim 15 wherein at least one of source or emitter contacts are provided over the top surface on either side of the trench and at least one of a drain or collector contact is provided over a bottom surface of the substrate.

17. The field effect device of claim 9 wherein the field effect device is a metal oxide semiconductor field effect device.

18. The field effect device of claim 9 wherein the field effect device is an insulated gate bipolar transistor.

19. The field effect device of claim 9 wherein the plurality of side walls are substantially perpendicular to the top surface.

20. The field effect device of claim 9 wherein the bottom is substantially parallel with the top surface.

21. The field effect device of claim 9 wherein the trench is generally V-shaped.

* * * * *